US 6,540,465 B2

(12) United States Patent
Tometsuka

(10) Patent No.: US 6,540,465 B2
(45) Date of Patent: Apr. 1, 2003

(54) SUBSTRATE PROCESSING APPARATUS

(75) Inventor: Kouji Tometsuka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/823,280

(22) Filed: Mar. 29, 2001

(65) Prior Publication Data

US 2001/0052325 A1 Dec. 20, 2001

(30) Foreign Application Priority Data

Mar. 30, 2000 (JP) ........................................ 2000-095055

(51) Int. Cl.[7] ............................................... H01L 21/00
(52) U.S. Cl. ........................................ 414/160; 414/217
(58) Field of Search ................................. 414/935, 937, 414/416, 217, 147, 160, 217.1

(56) References Cited

U.S. PATENT DOCUMENTS

| 4,770,590 A | * | 9/1988 | Hugues et al. ............... 198/395 |
| 5,829,939 A | * | 11/1998 | Iwai et al. ................... 414/411 |
| 5,879,415 A | * | 3/1999 | Shimada ..................... 29/25.01 |
| 5,981,966 A | * | 11/1999 | Honma ................... 250/559.33 |
| 6,053,980 A | * | 4/2000 | Suda et al. .................. 118/719 |
| 6,092,980 A | * | 7/2000 | Kumasaka et al. .......... 414/147 |

* cited by examiner

Primary Examiner—Eileen D. Lillis
Assistant Examiner—Charles Fox
(74) Attorney, Agent, or Firm—Hogan & Hartson, LLP

(57) ABSTRACT

A substrate processing apparatus that includes a preliminary chamber and a substrate transferring apparatus. The substrate transferring apparatus is disposed in the preliminary chamber for transferring substrate or substrates in and out of a cassette which accommodates the substrate or substrates. The cassette is allowed to be inserted into the preliminary chamber through a lower wall of the preliminary chamber from below.

23 Claims, 9 Drawing Sheets

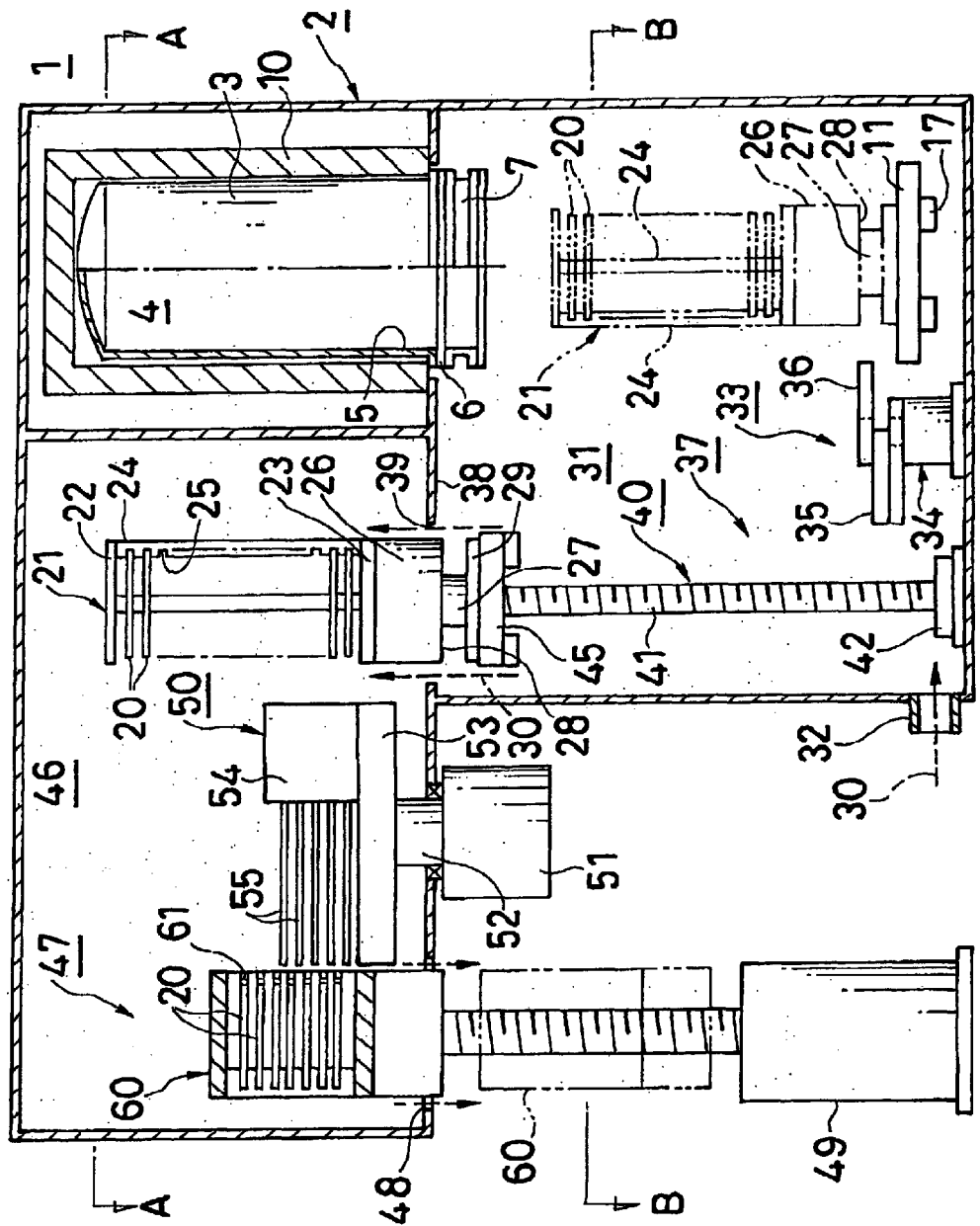

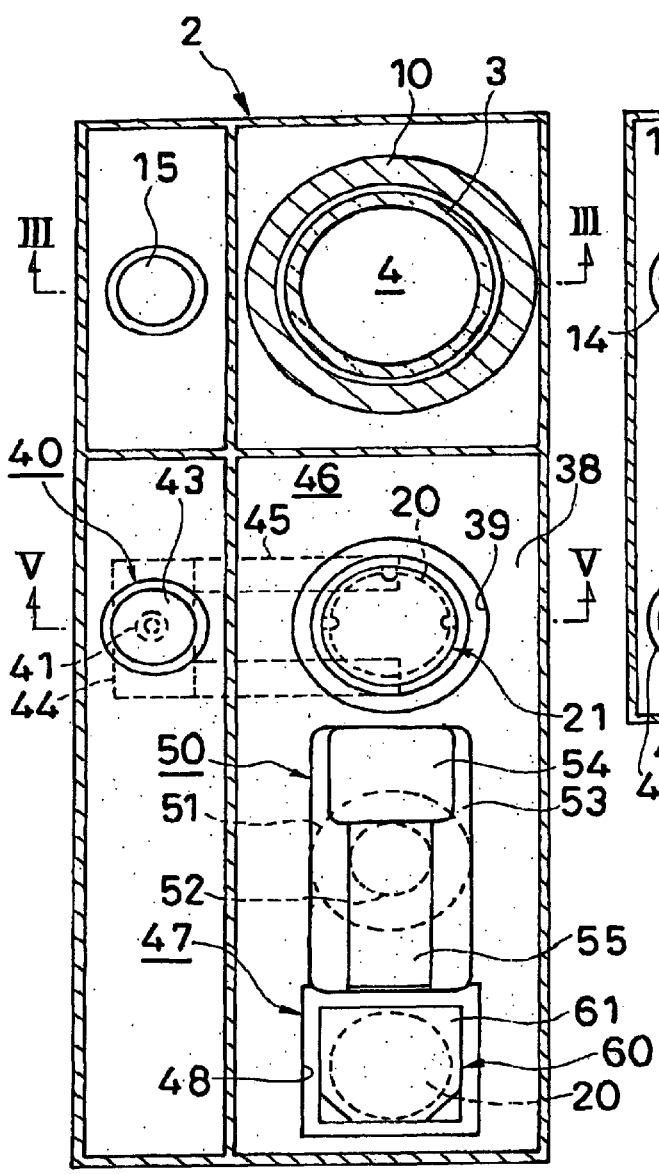
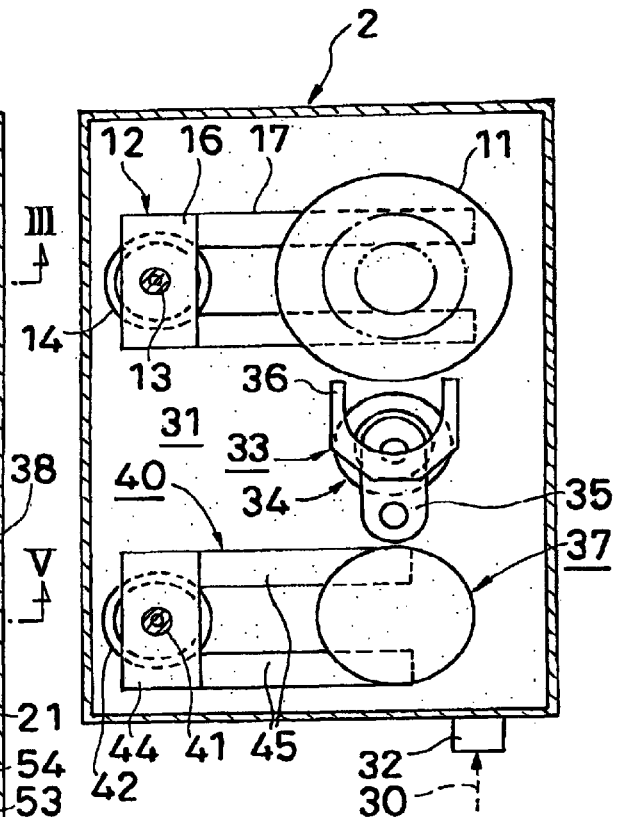
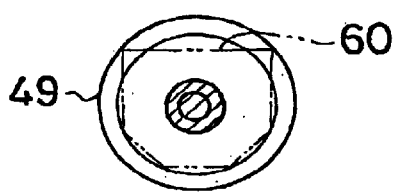

SUBSTRATE PROCESSING APPARATUS

BACKGROUND OF THE INVENTION

1. Field of the Invention

The present invention relates to a substrate processing apparatus, and more particularly, to an oxidation or contamination preventing technique for a substrate which is subjected to processing in an air-tightly closed processing chamber and for example, the invention can effectively be utilized for carrying out, for a semiconductor wafer, oxide film forming processing or diffusion processing, anneal processing and film forming processing in a producing process of a semiconductor device.

2. Description of the Related Art

In general, in a producing process of a semiconductor device, a batch-type vertical hot wall-type substrate processing apparatus is widely used for carrying out the oxide film forming processing or the diffusion processing, the anneal processing and the film forming processing for a semiconductor wafer (wafer, hereinafter).

For example, the batch-type vertical-type hot wall-type substrate processing apparatus (heat treatment apparatus, hereinafter) for carrying out heat treatment such as the oxide film forming processing or the diffusion processing, and the anneal processing comprises a vertically disposed process tube for forming a processing chamber into which wafers are to be transferred, a gas introducing port for introducing gas into the processing chamber, a discharge tube for evacuating the processing chamber to produce a vacuum, and a heater disposed outside the process tube for heating the processing chamber. A plurality of wafers are transferred into the processing chamber from a lower end furnace port in a state in which the wafers are concentrically arranged and held by a boat, the processing chamber is heated by the heater, and the heat treatment such as the oxide film forming processing or the diffusion processing, and the anneal processing is carried out.

In the conventional heat treatment apparatus, the wafers before they are transferred into the processing chamber or after they were transferred out from the processing chamber are in contact with atmosphere, and undergo oxidation due to oxygen or moisture included in the atmosphere. Therefore, there is a problem that a not-pre-assumed oxide film (natural oxide film, hereinafter) is uncontrollably formed on the wafer, and precision of processing such as the oxide film forming processing or the diffusion processing, and the anneal processing is lowered.

Thereupon, there has been proposed a heat treatment apparatus comprising a chamber formed with a preliminary chamber in which a boat stays on standby below a process tube, and inert atmosphere is formed in the preliminary chamber. In this heat treatment apparatus, wafers held by the boat which stays in the preliminary chamber on standby before the wafers are transferred into the processing chamber and after the wafers are transferred out from the processing chamber are placed in the inert atmosphere. Therefore, the wafers do not undergo oxidation by oxygen or moisture included in the atmosphere. As a result, an unnecessary oxide film is not formed on the wafer, and the problem that precision of processing is lowered is avoided.

In a heat treatment apparatus having a preliminary chamber forming inert atmosphere, wafers are attached and detached by a wafer transferring apparatus during a standby state of a boat in the preliminary chamber. In this case, if a wafer cassette (cassette, hereinafter) accommodating a plurality of wafers is directly transferred into and out from the preliminary chamber, a large amount of air outside the preliminary chamber is adversely introduced into the preliminary chamber when the cassette is transferred into and out from the preliminary chamber. Therefore, it is necessary to provide another preliminary chamber (cassette chamber, hereinafter) into and out from which the cassette is transferred, separately from the former preliminary chamber in terms of fluid.

However, if the cassette chamber is formed as a so-called load lock preliminary chamber whose cassette chamber is evacuated to produce a vacuum and into which nitrogen gas is charged, there is a problem that the producing cost and running cost are increased. Further, since the cassette has a relatively large volume, a large amount of air outside the cassette chamber is prone to be introduced into the cassette chamber when the cassette is transferred into and out from the cassette chamber. Therefore, in order to maintain low concentration air environment in the cassette chamber, it takes a long time to evacuate the cassette chamber to produce a vacuum, and to charge nitrogen gas, and this deteriorates the throughput of the heat treatment apparatus.

SUMMARY OF THE INVENTION

According to a first aspect of the present invention, there is provided a substrate processing apparatus, including:
  a process tube which forms a processing chamber provided at its lower end with a furnace port;
  a boat which is to go in and out from the processing chamber for transferring a substrate or substrates into and out from the processing chamber;
  a first preliminary chamber which is provided at one side of the process tube and which is to be charged with inert gas; and
  a substrate transferring apparatus disposed in the first preliminary chamber for transferring the substrate or the substrates between the boat and a cassette which accommodates the substrate or the substrates, wherein the boat and the cassette are respectively allowed to be inserted into the first preliminary chamber through a lower wall of the first preliminary chamber from below.

According to the substrate processing apparatus according to the first aspect of the present invention, since the cassette is inserted into the preliminary chamber into which the boat is inserted, it is unnecessary to form a special cassette chamber. Further, since the preliminary chamber is formed such that the cassette can be inserted into the preliminary chamber from below, the overflow of inert gas effectively prevents air outside the preliminary chamber from being introduced when the cassette is transferred into and out from the preliminary chamber. Therefore, according to the above measure, it is possible to enhance the processing precision while preventing the producing cost and running cost from being increased, and prevent the throughput from being deteriorated.

According to a second aspect of the present invention, there is provided a substrate processing apparatus, including:
  a processing chamber for processing a substrate or substrates;
  a substrate supporting member for supporting the substrate or the substrates in the processing chamber;
  a preliminary chamber which is to be charged with inert gas; and a substrate transferring apparatus for transferring, in the preliminary chamber, the substrate or the substrates between the substrate supporting member and a cassette which accommodates the substrate or the substrates, wherein the cassette is allowed to be inserted into the preliminary chamber through a lower wall of the preliminary chamber from below.

According to a third aspect of the present invention, there is provided a substrate processing apparatus, including:

a preliminary chamber; and a substrate transferring apparatus disposed in the preliminary chamber for transferring substrate or substrates in and out of a cassette which accommodates the substrate or the substrates, wherein the cassette is allowed to be inserted into the preliminary chamber through a lower wall of the preliminary chamber from below.

BRIEF DESCRIPTION OF THE DRAWINGS

The above and further objects, features and advantages of the present invention will become more apparent from the following detailed description taken in conjunction with the accompanying drawings, wherein:

FIG. 1 is a side sectional view showing a heat treatment apparatus according to a first embodiment of the present invention;

FIG. 2A is a sectional view taken along a line AA in FIG. 1;

FIG. 2B is a sectional view taken along a line BB in FIG. 1;

FIG. 2C is a view showing a cassette elevator 49 and a cassette 60 flow below;

DESCRIPTION OF THE PREFERRED EMBODIMENTS

Figure 3:
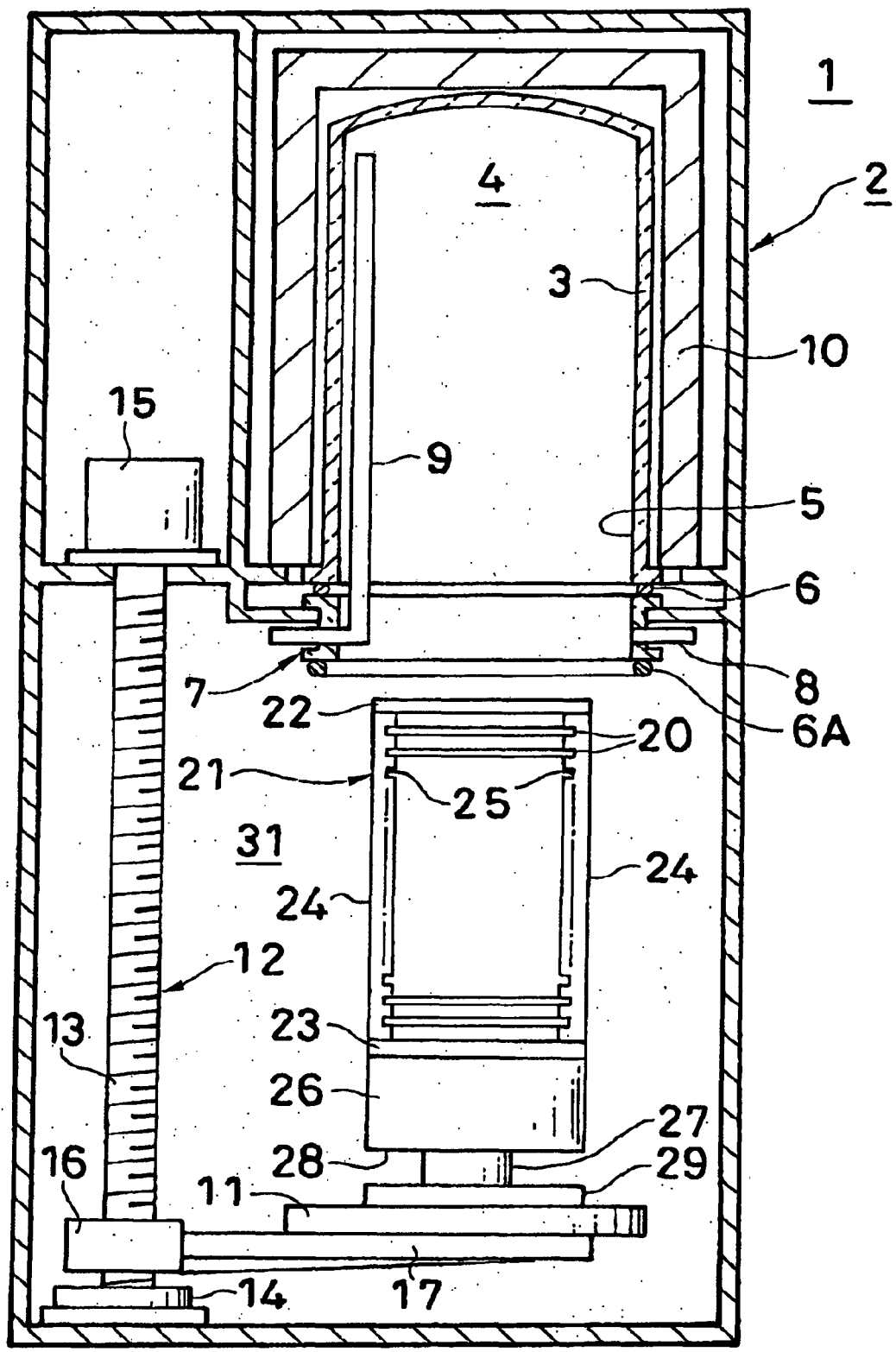
FIG. 3 is a front sectional view taken along a line III—III in FIG. 2A.

Embodiments according to the present invention will be explained below.

(First Embodiment)

In the present embodiment, a substrate processing apparatus according to the present invention is constructed as a batch-type vertical-type hot wall-type substrate processing apparatus (heat treatment apparatus hereinafter) for carrying out heat treatment such as oxide film forming processing or diffusion processing and anneal processing and is used for carrying out, for a wafer as a substrate, a heat treatment method such as the oxide film forming processing or the diffusion processing, and the anneal processing.

As shown in FIGS. 1–4, a heat treatment apparatus 1 includes a vertical process tube 3 which is supported by a machine frame (only a portion thereof is shown) 2 and disposed such that a center line thereof is directed vertically. The process tube 3 is made of quartz and integrally formed into a cylindrical shape whose lower end is opened. A cylindrical hollow portion of the process tube 3 forms a processing chamber 4. A plurality of wafers concentrically arranged and held by a boat are transferred into the processing chamber 4. The lower end opening of the process tube 3 is formed as a furnace port 5 through which the wafers are transferred into and out from the processing chamber 4. Therefore, an inner diameter of the process tube 3 is set larger than a maximum outer diameter of the wafer to be handled.

A lower end surface of the process tube 3 is in abutment against an upper end surface of a manifold 7 with a seal ring 6 interposed therebetween. The manifold 7 is supported by the machine frame 2 of the heat treatment apparatus 1 so that the process tube 3 is vertically supported.

A discharge port 8 for evacuating the processing chamber 4 to produce a predetermined vacuum is formed in a portion of a side wall of the manifold 7. The discharge port 8 is in communication with the processing chamber 4. A gas introducing tube 9 is inserted at a position opposed to the discharge port 8 formed in the side wall of the manifold 7. An insertion end of the gas introducing tube 9 extends to an upper end of the processing chamber 4. A supply source of processing gas and a supply source of inert gas (both not shown) are to be connected to the gas introducing tube 9. Gas introduced into the processing chamber 4 by the gas introducing tube 9 is discharged by the discharge port 8.

A heater unit 10 is concentrically disposed such as to surround the process tube 3 outside the process tube 3, and the heater unit 10 is configured so as to uniformly heat inside of the processing chamber 4 entirely. The machine frame 2 of the heat treatment apparatus supports the heater unit 10 so that the heater unit 10 is mounted vertically.

A disc-like cap 11 having substantially the same diameter as the outer diameter of the process tube 3 is concentrically disposed directly below the process tube 3. The cap 11 is hoisted and lowered in the vertical direction by an elevator 12 comprising a feed screw mechanism. That is, a feed screw 13 of an elevator 12 stands vertically on one side (left side in the present embodiment) of a process tube 3 directly below the process tube 3, and is rotatably supported by a bearing apparatus 14. The feed screw 13 is rotated in normal and reverse directions by a motor 15 disposed outside the preliminary chamber (which will be described later). A lifting and lowering base 16 is threadedly engaged with the feed screw 13 for lifting and lowering movement. A cap 11 is supported, in a cantilever manner, by an arm 17 which is horizontally fixed to the lifting and lowering base 16.

A boat 21 for holding a plurality of wafers 20 stands vertically on a centerline of the cap 11, and is supported on the cap 11. The boat 21 includes a pair of upper and lower end plates 22 and 23, and a plurality of (three in the present embodiment) holding members 24 bridged between both the end plates 22 and 23 and vertically disposed. Each of the holding members 24 is formed with a plurality of holding grooves 25 which are disposed at equal distances in a longitudinal direction of the holding member such that the holding grooves 25 are opened on the same plane of the holding member 24. The plurality of wafers 20 are horizontally arranged and held such that centers of the wafers 20 are aligned by inserting the wafers 20 between the holding grooves 25 of the holding members 24.

A heat insulating cap 27 is formed below the lower end plate 23 of the boat 21. A cylindrical column 27 having a diameter smaller than an outer diameter of an heat insulating cap 26 is projected downward from a lower surface of a heat insulating cap 26. A space into which a boat support member of a boat transferring apparatus (which will be described later) is inserted is formed outside the column 27 on a lower surface of the heat-insulating cap 26. An engaging portion 28 for engaging the boat support member is formed by an outer peripheral portion of a lower surface of the heat-insulating cap 26. A space 29 is horizontally formed below a lower surface of the column 27.

As shown in FIGS. 1 and 2, a processing chamber (tube-side preliminary chamber, hereinafter) into which nitrogen gas 30 as inert gas is charged is formed in a space below the process tube 3 in an inner space of a casing 2. That is, a nitrogen gas supplying tube 32 for supplying the nitrogen gas 30 as the inert gas to the tube-side preliminary chamber 31 is connected to a lower portion of a sidewall forming the tube-side preliminary chamber 31 of the casing 2.

A buffer stage 37 into and out from which the boat 21 is transferred is formed in a region opposite from the cap 11 of the tube-side preliminary chamber 31. A boat transferring apparatus 33 for transferring the boat 21 between the buffer stage 37 and the cap 11 is provided in a midpoint position between the buffer stage 37 and the cap 11. The boat transferring apparatus 33 comprises a robot 34 having an arm 35 which is turned in a horizontal plane. A boat support member 36 is horizontally mounted to a tip end of the arm 35. The boat support member 36 is formed into a fork-like shape. If the boat support member 36 engages the engaging portion 28 of the heat insulating cap 26 from below in a state in which the boat support member 36 is inserted into outer sides of the column 27 of a lower end of the boat 21, the boat support member 36 supports the entire boat 21 vertically.

Figure 5:
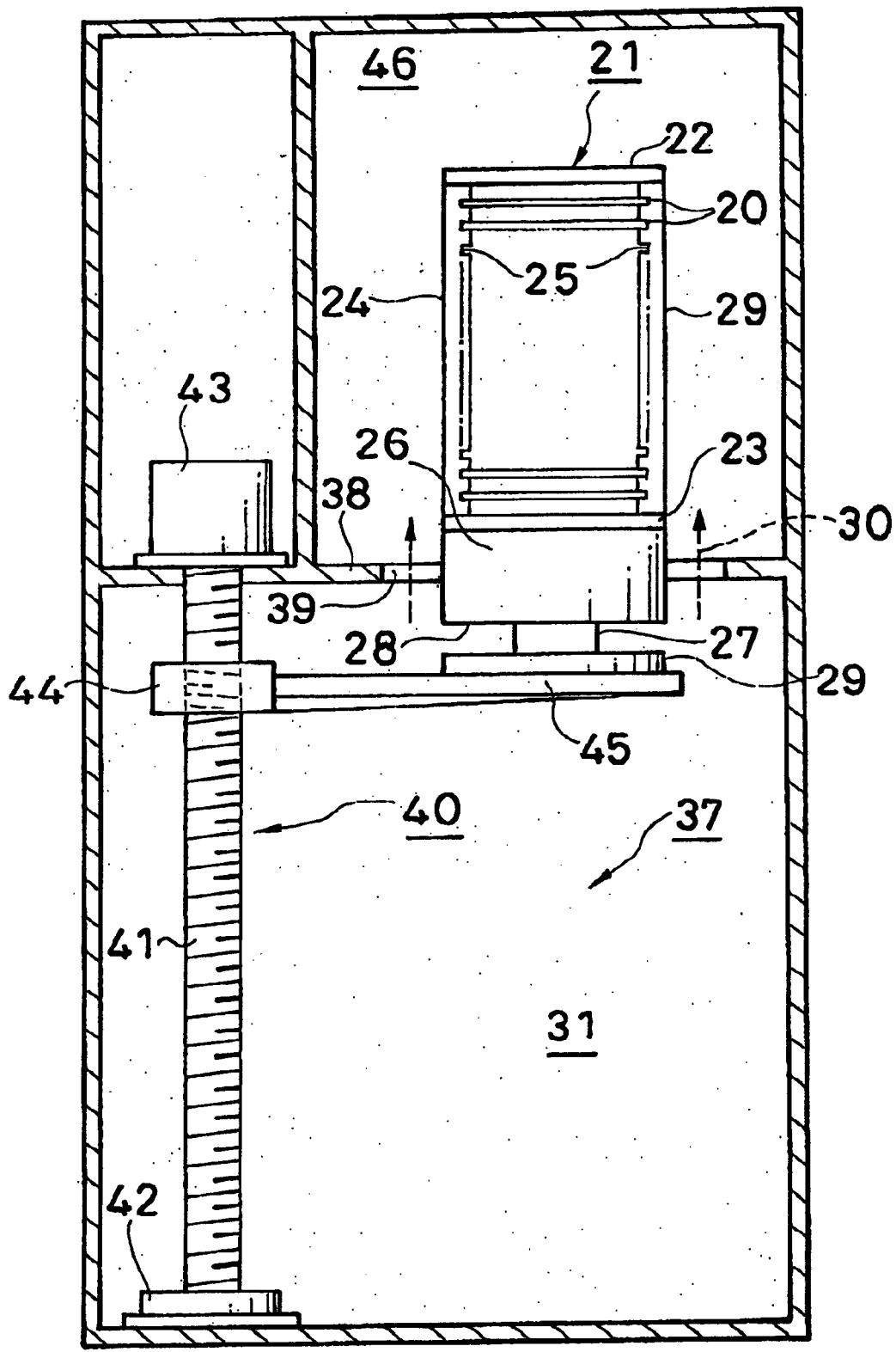
FIG. 5 is a front sectional view taken along a line V—V in FIG. 2A.
Figure 6:
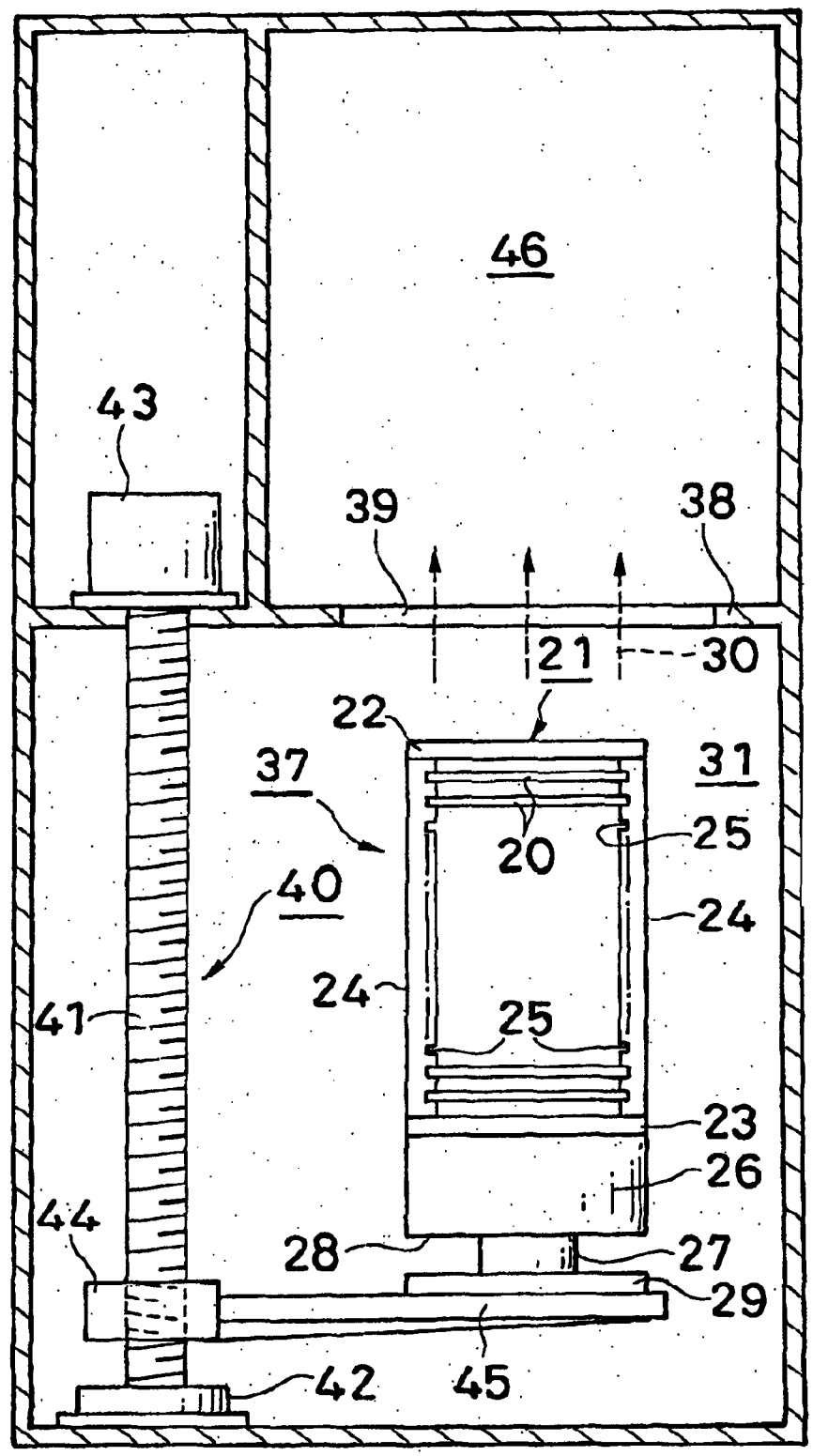
FIG. 6 is a front sectional view taken along a line III—III in FIG. 2A showing when a boat is lowering.

As shown in FIGS. 5 and 6, a boat port 39 through which the boat 21 passes is formed in a ceiling wall 38 of the tube-side preliminary chamber 31 at a position corresponding to the buffer stage 37. A diameter of the boat port 39 is slightly greater than an outer diameter of the boat 21. An elevator (boat elevator, hereinafter) 40 for transferring the boat 21 into and out from the boat port 39 is provided in a buffer stage 37 of the tube-side preliminary chamber 31. The boat elevator 40 comprises a feed screw mechanism, so that the boat elevator 40 lifts and lowers the boat 21 in the vertical direction. That is, the feed screw 41 of the elevator 40 stands vertically on one side (left side in the present embodiment) of the boat port 39 directly below the boat port 39, and is rotatably supported by a bearing apparatus 42. The feed screw 41 is rotated in normal and reverse directions by a motor 43 disposed outside the tube-side preliminary chamber 31. A lifting and lowering base 44 is threadedly engaged with the feed screw 41 for lifting and lowering movement. An arm 45 horizontally fixed to the lifting and lowering base 44 supports the boat 21 in a cantilever manner to lift and lower the boat 21.

As shown in FIGS. 1 and 2, a preliminary chamber 46 into which the nitrogen gas 30 as the inert gas is charged is formed in an inner space of the casing 2 above the tube-side preliminary chamber 31. The nitrogen gas 30 supplied to the tube-side preliminary chamber 31 overflows from the boat port 39 and is supplied to the preliminary chamber 46. A cassette stage 47 for transferring the cassette in and out is formed in a region opposite from the boat port 39, of the preliminary chamber 46. A wafer transferring apparatus 50 is provided in a midpoint position between the cassette stage 47 of the preliminary chamber (cassette-side preliminary chamber, hereinafter) 46 and the boat port 39 for delivering and receiving the wafer 20 between the boat 21 and the wafer transferring apparatus 50.

The wafer transferring apparatus 50 includes a rotary robot 51 disposed outside of a bottom wall of the cassette-side preliminary chamber 46. A pivot 52 of the rotary robot 51 upwardly passes through the bottom wall. A horizontal shaft robot 53 is horizontally disposed on an upper end of the pivot 52, and the horizontal shaft robot 53 allows a mounting block 54 to slide in the horizontal direction. A plurality of (five, in the present embodiment) tweezers, 55 for supporting the wafers 20 from below are horizontally mounted to the mounting block 54 at equal distances from one another.

A cassette port 48 larger than the cassette is formed in a bottom wall of the cassette-side preliminary chamber 46 at a position corresponding to the cassette stage 47. The nitrogen gas 30 in the cassette-side preliminary chamber 46 overflows outside from the cassette port 48. An elevator 49 comprising a screw jack is upwardly disposed directly below the cassette port 48 outside the cassette-side preliminary chamber 46. This elevator (cassette elevator, hereinafter) 49 lifts and lowers the cassette 60, thereby transferring the cassette 60 into and out from the cassette port 48.

The cassette 60 is formed into a substantially cubic box-like shape having a pair of opposed surfaces are opened. A plurality of (e.g., 25) holding grooves 61 are formed in inner surfaces of a pair of side walls perpendicular to the opened surfaces. The holding grooves 61 are opened in the same plane at equal distances from one another. That is, the cassette 60 inserts the wafers 20 between the pair of opposed holding grooves 61 and 61 from one of the openings, thereby holding the plurality of wafers 20 in a state in which the wafers 20 are arranged horizontally and centers of the wafers 20 are aligned.

Next, operation of the heat treatment apparatus having the above-described structure will be explained based on a case in which the wafers are subjected to the anneal processing.

When the heat treatment apparatus is used to anneal the wafer, the nitrogen gas 30 is previously charged into the tube-side preliminary chamber 31 and the cassette-side preliminary chamber 46. That is, the nitrogen gas 30 is supplied to the tube-side preliminary chamber 31 from the nitrogen gas supplying tube 32. Since the nitrogen gas 30 is heavier than air, the nitrogen gas 30 is charged from the bottom of the tube-side preliminary chamber 31 sequentially while discharging air, and the nitrogen gas 30 overflows into the cassette-side preliminary chamber 46 from the boat port 39. The nitrogen gas 30 which overflowed into the cassette-side preliminary chamber 46 is charged into the cassette-side preliminary chamber 46 while being discharged from the cassette port 48. At that time, it is preferable to adjust a flow rate of the nitrogen gas 30 such that a flow rate of overflow of the nitrogen gas 30 from the cassette port 48 is smaller than a flow rate of overflow of the overflow of the nitrogen gas 30 from the boat port 39.

As shown in FIGS. 1 and 2, a cassette 60 in which the plurality of wafers 20 are accommodated is mounted on the cassette elevator 49 and lifted upward, and transferred from the cassette port 48 into the cassette stage 47 which is set in the inner space of the cassette-side preliminary chamber 46. At that time, since the nitrogen gas 30 overflows from the cassette port 48 when the cassette 60 passes through the cassette port 48, air outside the cassette-side preliminary chamber 46 is prevented from being introduced into the cassette-side preliminary chamber 46.

As shown in FIGS. 1 and 2, the wafers 20 of the cassette 60 transferred into the cassette stage 47 in the inner space of the cassette-side preliminary chamber 46 are transferred to the boat 21 lifted by the boat port 39 of the cassette-side preliminary chamber 46 by means of the wafer transferring apparatus 50, the cassette elevator 49 and the boat elevator 40. At that time, since the wafer transferring apparatus 50 includes the five tweezers 55, the wafer transferring apparatus 50 transfers five wafers 20 to the five holding grooves 25 in one transfer operation.

That is, the mounting block 54 of the wafer transferring apparatus 50 is moved forward in a direction of the cassette 60 by the horizontal shaft robot 53, and the five tweezers 55 are inserted below the five wafers 20. Then, the wafers 20 are lowered by the cassette elevator 49, and the five wafers 20 are placed on the five tweezers 55 respectively. Next, if the mounting block 54 is retreated from the cassette 60 by the horizontal shaft robot 53, the five wafers 20 are transferred out from the cassette 60 by the five tweezers 55. At that time, in order to prevent a foreign substance from being dropped and adhered-to the wafer located below during the transfer operation of the wafers 20 from the cassette 60, it is preferable to transfer the wafers 20 out from the cassette 60 in the order from a lower wafer to an upper wafer.

If the tweezers 55 transferred the wafers 20 from the cassette 60, the horizontal shaft robot 53 is turned by the rotary robot 51 through 180° and then, the mounting block 54 is moved forward in a direction of the boat 21 by the horizontal shaft robot 53, and the tweezers 55 inserts the wafers 20 into the five the holding grooves 25 of the boat 21. Then, if the boat 21 is lifted by the boat elevator 40, the five wafers 20 are received respectively by the five holding grooves 25 from the five tweezers 55. Then, the mounting block 54 is retreated from the boat 21 by the horizontal shaft robot 53, and the five tweezers 55 are transferred out from the boat 21. At that time, in order to prevent a foreign substance from being dropped and adhered to the wafer located below during the transfer operation of the wafers 20 to the boat 21, it is preferable to transfer the wafers 20 to the boat 21 from upper holding grooves 25.

By repeating the above-described operation, the wafers 20 are transferred from the cassette 60 to the boat 21. At that time, since the number of wafers 20 to be batch-processed by the boat 21 is greater than the number of wafers 20 accommodated in one cassette 60, a plurality of cassettes 60 are repeatedly supplied to the cassette stage 47 by the cassette elevator 49.

As shown in FIG. 6, when the preset number of wafers 20 are transferred to the boat 21 from the cassette 60, the boat 21 lowers through the boat port 39 to the tube-side preliminary chamber 31 from the cassette-side preliminary chamber 46 by the boat elevator 40. At that time, the nitrogen gas 30 overflows from the boat port 39 in the direction from the tube-side preliminary chamber 31 toward the cassette-side preliminary chamber 46. Therefore, when the boat 21 passes through the boat port 39, even if air is introduced into the cassette-side preliminary chamber 46, the air in the cassette-side preliminary chamber 46 does not enter the tube-side preliminary chamber 31.

When the boat 21 is lowered to the tube-side preliminary chamber 31 in the above-described manner, the boat 21 is supplied to the buffer stage 37 as shown in FIG. 6. The boat 21 supplied to the buffer stage 37 is transferred onto the cap 11 by the boat transferring apparatus 33 as shown in FIG. 3.

As shown in FIGS. 1 and 2, when the boat 21 is transferred by the boat transferring apparatus 33, the fork-like boat support member 36 of the boat transferring apparatus 33 is inserted into the outer sides of the column 27 of the boat 21 and in this state, the boat support member 36 engages the engaging portion 28 of the heat insulating cap 26 from below, thereby vertically supporting the entire boat 21. In the state in which the boat support member 36 engages the engaging portion 28 from below, if the boat 21 is slightly lowered by the boat elevator 40, the boat 21 is received by the boat support member 36 from the arm 45 of the boat elevator 40.

The boat support member 36 which received the boat 21 transfers, the boat 21 directly above the cap 11 of the processing elevator 12 by turning the arm 35 using the robot 34. If the boat 21 is transferred directly above the cap 11, the cap 11 is slightly lifted by the processing elevator 12, and the boat 21 is received by the cap 11 from the boat support member 36.

At that time, since the nitrogen gas 30 is previously charged into the tube-side preliminary chamber 31, the boat 21 is transferred onto the cap 11 directly above the processing chamber 4. Even if the wafers 20 held by the boat 21 are exposed with radiant heat of the high-temperature processing chamber 4, an oxide film is not naturally formed on the wafer 20. In other words, in order to prevent the natural oxide film from being formed, it is unnecessary to lower a temperature of the processing chamber 4 which is on, standby. As a result, it is possible to prevent the throughput from being lowered by a temperature-lowering step of the processing chamber 4 in a standby state.

Figure 4:
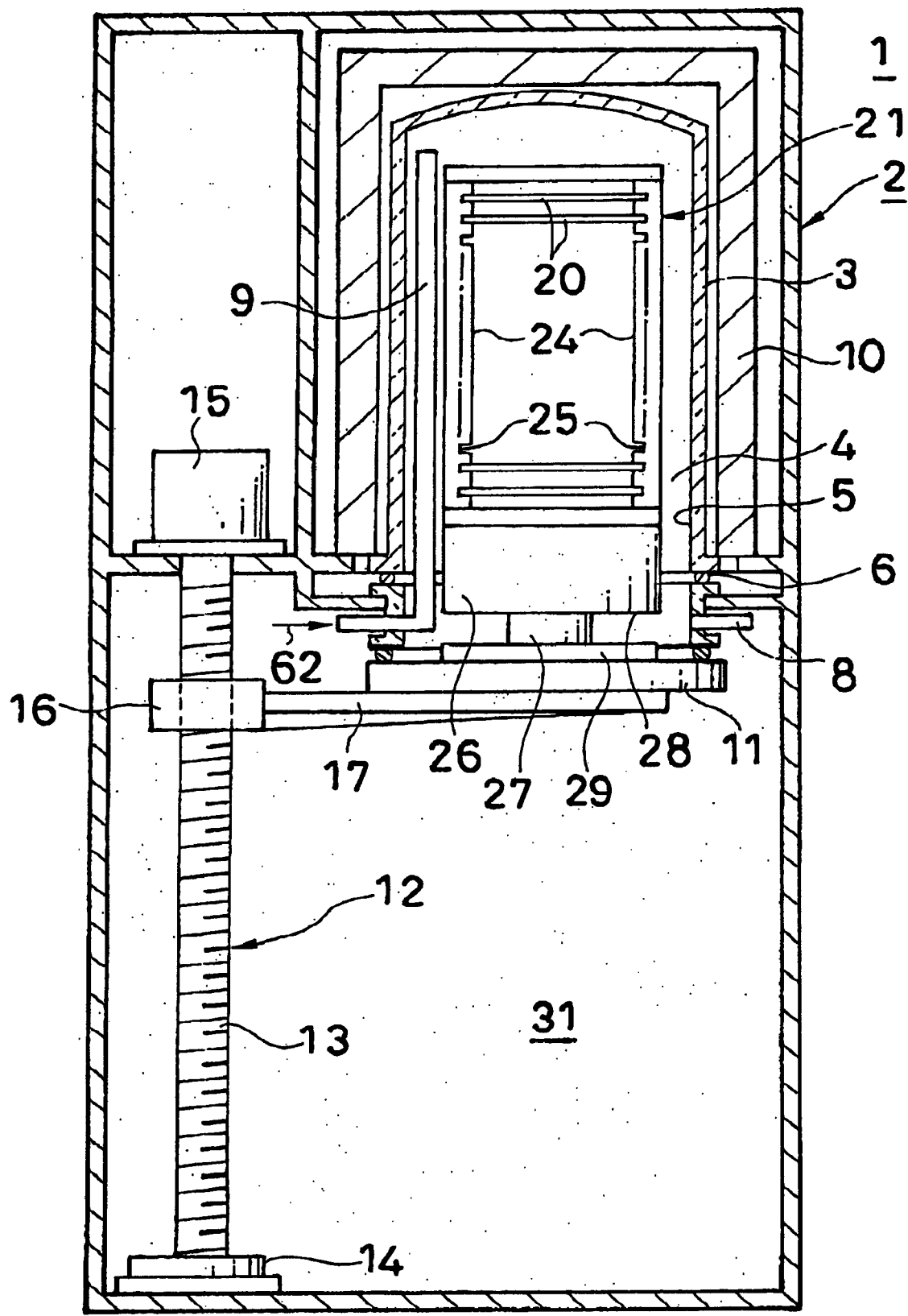
FIG. 4 is a front sectional view taken a long a line III—III in FIG. 2A showing when processing is performed.

If the boat 21 is mounted to the cap 11 in the above-described manner, the boat 21 is lifted by the processing elevator 12 and transferred into the processing chamber 4 of the process tube 3 as shown in FIG. 4. If the boat 21 reached the upper limit, the peripheral portion of the upper surface of the cap 11 seats on the lower surface of the manifold 7 with a sealing ring 6A sandwiched therebetween, thereby closing the lower end opening of the manifold 7 in a sealed state, and the processing chamber 4 is closed air-tightly.

In a state in which the processing chamber 4 is air-tightly closed by the cap 11, the processing chamber 4 is evacuated by the discharge port 8 to produce a predetermined vacuum, and the entire processing chamber 4 is heated equally to an anneal temperature (800 to 1000° C.) by the heater unit 10. The processing gas 62 such as nitrogen gas is supplied to the processing chamber 4 by the gas introducing tube 9 with a predetermined flow rate, and a predetermined anneal processing is carried out.

If the preset processing time is elapsed, the cap 11 supporting the boat 21 is lowered by the processing elevator 12 as shown in FIG. 3, and the processed boat 21 is transferred out to its standby position from the processing chamber 4.

At that time also, since the nitrogen gas 30 is previously charged into the tube-side preliminary chamber 31, even if the boat 21 is transferred to the tube-side preliminary chamber 31 from the processing chamber 4 and the wafer 20 is exposed with atmosphere of the tube-side preliminary chamber 31, a natural oxide film is not formed on the wafer 20. In other words, in order to prevent the natural oxide film from being formed it is unnecessary to lower a temperature of the processing chamber 4 which is on standby. As a result, it is possible to prevent the throughput from being lowered by lowering a temperature of the processing chamber 4 in a standby state.

The boat 21 which was lowered to the standby position is transferred to the buffer stage 37 by the boat transferring apparatus 33, and is transferred onto the arm 45 of the boat elevator 40 as shown in FIG. 6. During the returning movement from the cap 11 to the buffer stage 37, the boat transferring apparatus 33 receives the boat 21 in cooperation with the processing elevator 12 and the boat elevator 40.

If the boat 21 is transferred onto the arm 45 of the boat elevator 40 of the buffer stage 37, as shown in FIG. 5, the boat 21 is lifted from the tube-side preliminary chamber 31 to the cassette-side preliminary chamber 46 through the boat port 39 by the boat elevator 40. At that time, the nitrogen gas 30 overflows from the boat port 39 in the direction from the tube-side preliminary chamber 31 toward the cassette-side preliminary chamber 46. Therefore, when the boat 21 passes through the boat port 39, even if air is introduced into the cassette-side preliminary chamber 46, the air of the cassette-side preliminary chamber 46 does not enter the tube-side preliminary chamber 31.

As shown in FIG. 1, the wafers 20 in the boat 21 lifted to the boat port 39 of the cassette-side preliminary chamber 46 are transferred by the wafer transferring apparatus 50, the boat elevator 40 and the cassette elevator 49 to the cassette 60 which was lifted to the cassette stage 47 of the cassette-side preliminary chamber 46. At that time, in order to prevent a foreign substance from being dropped and adhered to the wafer located below during the transfer operation of the wafers 20 from the boat 21, it is preferable to transfer the wafers 20 from the boat 21 from lower wafer to upper wafer. Further, in order to prevent a foreign substance from being dropped and adhered to the wafer located below during the transfer operation of the wafers 20 to the cassette 60, it is preferable to transfer the wafers 20 to the cassette 60 from upper holding groove 25 to lower holding groove 25.

The cassette 60 accommodating the predetermined number of processed wafers 20 is lowered through the cassette port 48 by the cassette elevator 49, and is transferred out from the cassette-side preliminary chamber 46 through the cassette stage 47 set in the inner space of the cassette-side preliminary chamber 46. At that time, since the nitrogen gas 30 overflows from the cassette port 48, when the cassette 60 passes through the cassette port 48, air outside the cassette-side preliminary chamber 46 is prevented from being introduced into the cassette-side preliminary chamber 46. Then, the cassette 60 which was transferred out from the cassette-side preliminary chamber 46 is transferred to a next step.

Thereafter, the above-described operation is repeated, and the wafers 20 are batch-processed by the heat treatment apparatus 1.

According to the present embodiment, the following effect can be obtained.

1) A preliminary chamber is charged with nitrogen gas, a boat is transferred into and out from the preliminary chamber, and the cassette is transferred into and out from the preliminary chamber. Therefore, it is unnecessary to separately form a special cassette chamber of a load lock structure to and out from which the cassette is transferred and thus, it is possible to reduce the producing cost and running cost of the heat treatment apparatus, and management time for maintaining low concentration air environment in the cassette of the load lock structure is omitted, and the throughput of the heat treatment apparatus can be enhanced.

2) Since the cassette port is formed in the bottom wall of the preliminary chamber so that the cassette is inserted into the preliminary chamber from below, it is possible to effectively prevent the outside air from being introduced into the preliminary chamber by the overflow of the nitrogen gas when the cassette is transferred into and out from the preliminary chamber. Therefore, the cassette can directly be transferred into and out from the preliminary chamber to and out from which the boat is transferred.

3) Since the preliminary chamber charged with nitrogen gas is provided, it is possible to prevent a wafer from coming into contact with air. Therefore, it is possible to prevent a natural oxide film from being generated by the contact with air.

4) Since the natural oxide film is prevented from being generated on the wafer, it is unnecessary to lower a temperature of the preliminary chamber which is on standby, and it is possible to prevent the throughput from being deteriorated by lowering the temperature of the preliminary chamber which is on standby.

5) Since it is possible to reliably prevent the natural oxide film from being formed on the wafer, it is possible to enhance quality and reliability of a semiconductor device produced using the wafer.

6) Since on-off valves for the cassette port and the boat port of the preliminary chamber are omitted, a valve operating apparatus software and the like for a controller required for controlling are omitted. Correspondingly, it is possible to reduce the producing cost and running cost of the heat treatment apparatus, and it is possible to prevent dust cased by opening and closing operation of the valve from being generated.

(Second Embodiment)

Figure 7:
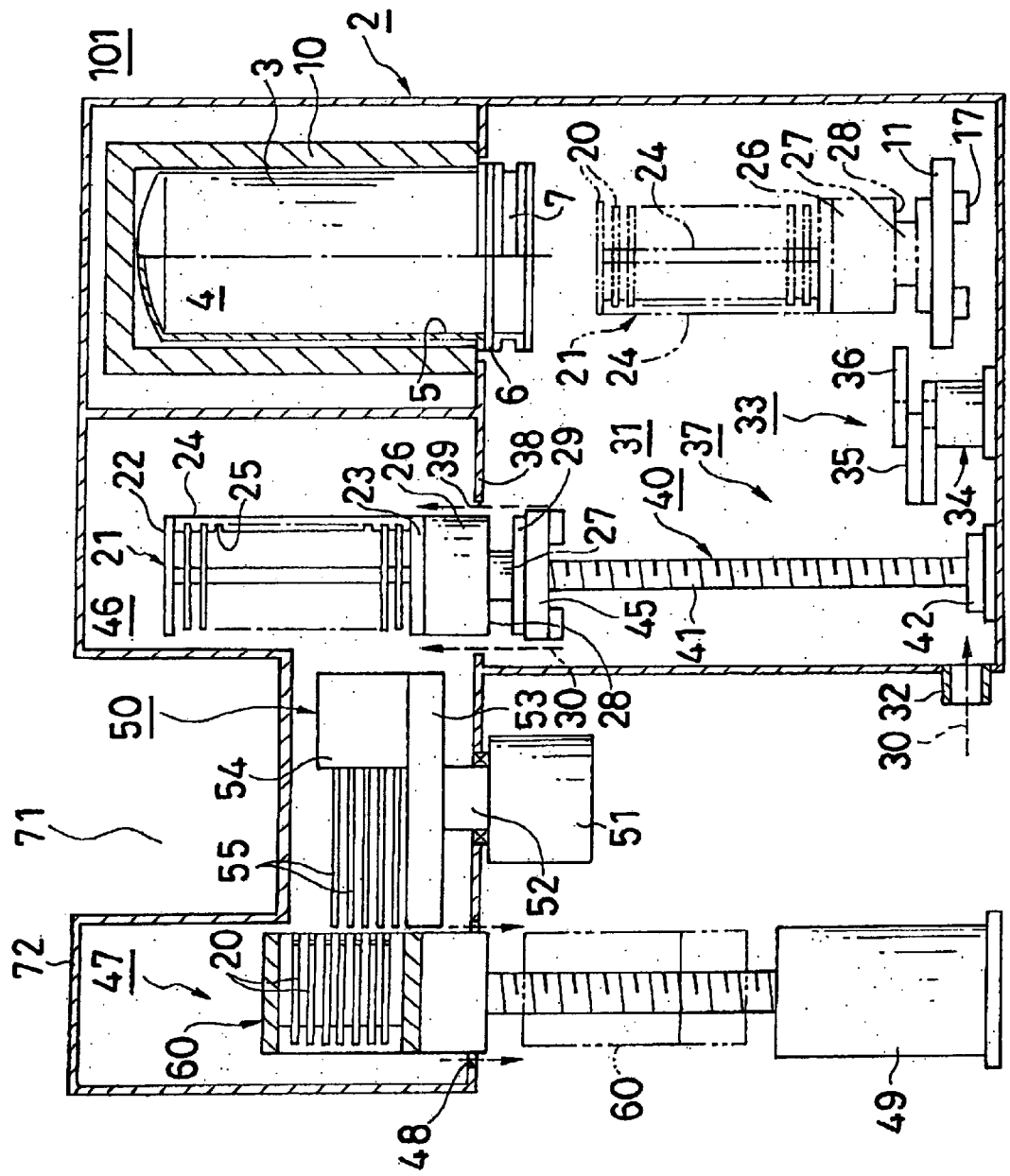
FIG. 7 is a side sectional view showing a heat treatment apparatus according to a second embodiment of the present invention.

Referring to FIG. 7, a heat treatment apparatus 101 of this second embodiment is different from the heat treatment apparatus 1 of the first embodiment in that the recess 71 is formed in the ceiling wall 72 of the wafer transferring apparatus 50 of the cassette-side preliminary chamber 46, and other portions are the same. With this recess 71, the volume of the preliminary chamber 46 is reduced and thus, an amount of inert gas ($N_2$ gas) to be used can be reduced.

(Third Embodiment)

Figure 8A:
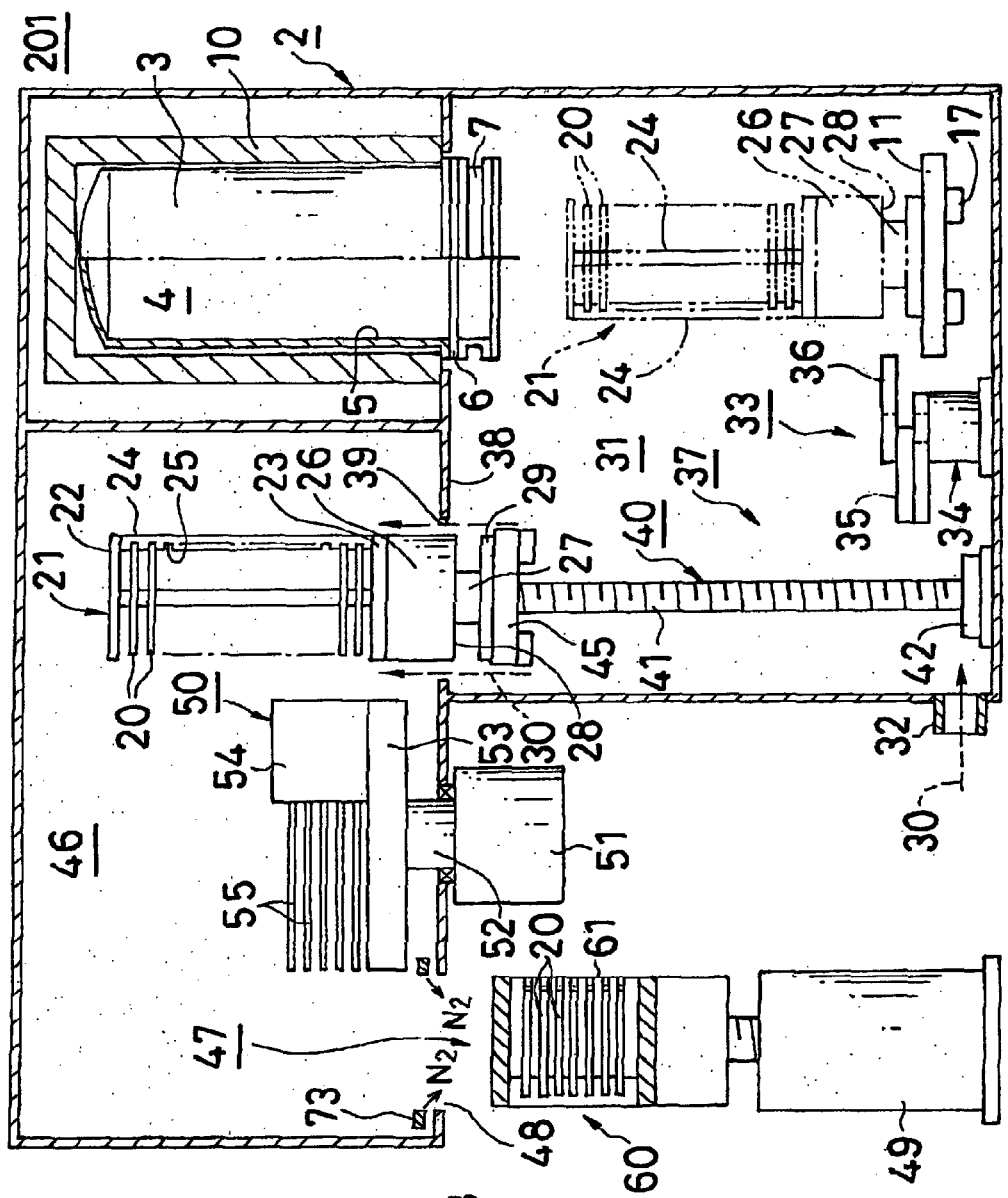
FIG. 8A is a side sectional view showing a heat treatment apparatus according to a third embodiment of the present invention.
Figure 8B:
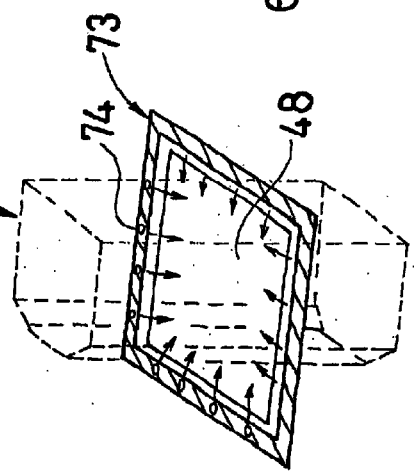
FIG. 8B is an enlarged perspective view showing an inert gas injection tube 73 and an opening 48.

Referring to FIGS. 8A and 8B, a heat treatment apparatus 201 of this third embodiment is different from the heat treatment apparatus 1 of the first embodiment in that the inert gas injection tube 73 is formed in a periphery of the inside of the cassette-side preliminary chamber 46 directly above a cassette port 48, and other portions are the same.

The inert gas injection tube 73 is provided around the cassette ports 48, and comprises a predetermined number of injection holes 74 such that inert gas can be injected toward the cassette port 48. The inert gas may be injected only when the cassette 60 is transferred in and out during which there is an adverse possibility that atmosphere is introduced. With this embodiment, it is possible to further prevent atmosphere from being introduced when the cassette 60 is transferred in and out.

(Fourth Embodiment)

Figure 9:
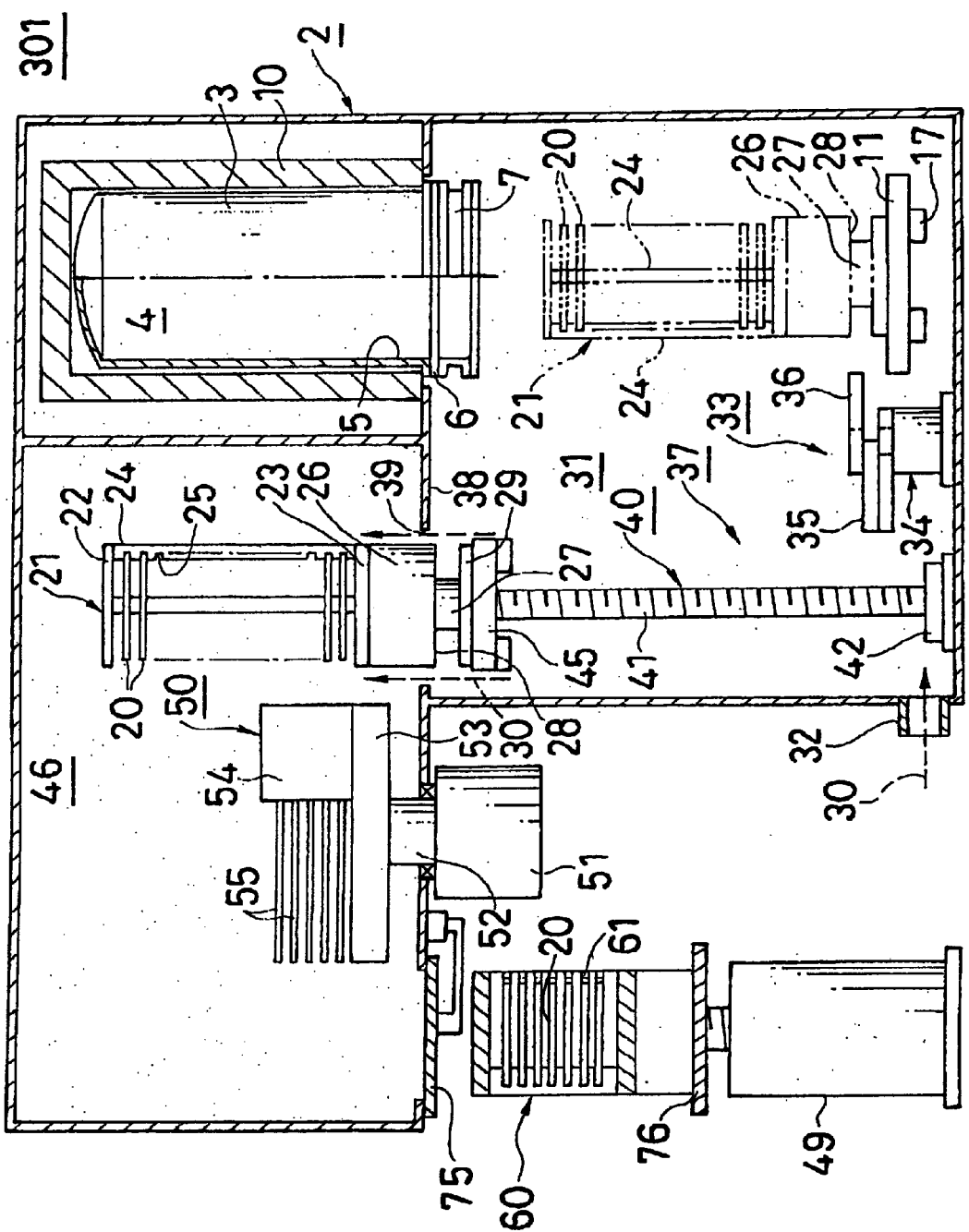
FIG. 9 is a side sectional view showing a heat treatment apparatus according to a fourth embodiment of the present invention.

Referring to FIG. 9, a heat treatment apparatus 301 of this fourth embodiment is different from the heat treatment apparatus 1 of the first embodiment in that the heat treatment apparatus 301 comprises a shutter 75 provided outside the cassette-side preliminary chamber 46 for closing the cassette port 48 when a cassette exists outside the preliminary chamber 46, and a cap 76 provided on an upper portion of the cassette elevator 49, the cassette 60 is mounted on the cap 76, and the cap 76 closes the cassette port 48 when the cassette 60 is transferred into the preliminary chamber 46. Other portions are the same.

The shutter 75 is turned between its opened position and its retreated position corresponding to the cassette port 48 within a horizontal plane. By providing the shutter 75, it is possible to prevent $N_2$ from flowing out from the cassette port 48 and thus, an amount of $N_2$ to be used can be reduced. Atmosphere is further prevented from being introduced. When the cassette 60 exists in the preliminary chamber 46, since the cassette port 48 is closed with the cap 76, atmosphere is further prevented from being introduced and the amount of $N_2$ to be used can be reduced. Since the cap 76 is added, the cassette 60 can not be moved vertically when the wafer is transferred. Thus, the wafer transferring apparatus 50 moves vertically to transfer the wafer 20 between the cassette 60 and the boat 21.

The present invention is not limited to the above embodiments, and it is of course possible to make various modifications without departing from the gist of the present invention.

For example, the number of cassettes to be transferred to and out from the preliminary chamber is not limited to one, and a plurality of cassettes (e.g., four, which corresponds to 100 wafers) cassettes may be piled up on the cassette elevator and transferred in and out.

The substrate to be processed is not limited to the semiconductor wafer, and the substrate to be processed may be a glass substrate for producing a liquid crystal panel or the like.

The heat treatment apparatus is not limited to one for forming the oxide film, and the heat treatment apparatus can be used for heat treatment such as oxide film formation processing and diffusion processing.

Although the embodiments have been described based on the batch-type vertical-type hot wall-type substrate processing apparatus, the present invention is not limited to this, and the present invention can be applied to a substrate processing apparatus such as a batch-type vertical-type hot wall-type CVD apparatus and the like.

As explained above, according to the present invention, it is possible to enhance the processing precision while preventing the producing cost and running cost from being increased, and preventing the throughput from being deteriorated.

The entire disclosure of Japanese Patent Application No. 2000-95055 filed on Mar. 30, 2000 including specification, claims, drawings and summary are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus, comprising:
   a process tube which forms a processing chamber provided at its lower end with a furnace port;
   a boat which is to go in and out from said processing chamber for transferring a substrate or substrates into and out from said processing chamber;
   a first preliminary chamber which is provided at one side of said process tube and which is to be charged with inert gas; and
   a substrate transferring apparatus disposed in said first preliminary chamber for transferring said substrate or said substrates between said boat and a cassette which accommodates said substrate or said substrates, wherein
   said boat and said cassette are respectively allowed to be inserted into said first preliminary chamber through a lower wall of said first preliminary chamber from below.

2. The substrate processing apparatus according to claim 1, wherein a second preliminary chamber is provided under said process tube and said first preliminary chamber, and a boat port through which said boat goes in and out is formed in a boundary between said first preliminary chamber and said second preliminary chamber.

3. The substrate processing apparatus according to claim 1, wherein said lower wall of said first preliminary chamber is a bottom wall of said first preliminary chamber.

4. The substrate processing apparatus according to claim 1, wherein an inside surface of said first preliminary chamber is adjacent to said substrate transferring apparatus both above and below said substrate transferring apparatus such that a volume of said inert gas needed to fill said first preliminary chamber is reduced.

5. The substrate processing apparatus according to claim 1, wherein said first preliminary chamber has a cassette port through which said cassette is inserted into said first preliminary chamber.

6. The substrate processing apparatus according to claim 5, further comprising a gas injection tube provided in said first preliminary chamber which injects additional inert gas toward said cassette port.

7. The substrate processing apparatus according to claim 6, wherein said gas injection tube injects said additional inert gas only when said cassette is transferred through said cassette port.

8. The substrate processing apparatus according to claim 5, further comprising a shutter for covering said cassette port when said cassette is outside of said first preliminary chamber.

9. The substrate processing apparatus according to claim 5, further comprising a cassette elevator having a cap for covering said cassette port when said cassette is inside of said first preliminary chamber, wherein said cassette is inserted into said first preliminary chamber from below by said cassette elevator.

10. A substrate processing apparatus, comprising:
    a processing chamber for processing a substrate or substrates;
    a substrate supporting member for supporting said substrate or said substrates in said processing chamber;
    a preliminary chamber which is to be charged with inert gas; and
    a substrate transferring apparatus for transferring, in said preliminary chamber, said substrate or said substrates between said substrate supporting member and a cassette which accommodates said substrate or said substrates, wherein
    said cassette is allowed to be inserted into said preliminary chamber through a lower wall of said preliminary chamber from below.

11. The substrate processing apparatus according to claim 10, wherein said lower wall of said preliminary chamber is a bottom wall of said preliminary chamber.

12. The substrate processing apparatus according to claim 10, wherein an inside surface of said preliminary chamber is adjacent to said substrate transferring apparatus both above and below said substrate transferring apparatus such that a volume of said inert gas needed to fill said preliminary chamber is reduced.

13. The substrate processing apparatus according to claim 10, wherein said preliminary chamber has a cassette port through which said cassette is inserted into said preliminary chamber.

14. The substrate processing apparatus according to claim 13, further comprising a gas injection tube provided in said preliminary chamber which injects additional inert gas toward said cassette port.

15. The substrate processing apparatus according to claim 14, wherein said gas injection tube injects said additional inert gas only when said cassette is transferred through said cassette port.

16. The substrate processing apparatus according to claim 13, further comprising a shutter for covering said cassette port when said cassette is outside of said preliminary chamber.

17. The substrate processing apparatus according to claim 13, further comprising a cassette elevator having a cap for covering said cassette port when said cassette is inside of said preliminary chamber, wherein said cassette is inserted into said preliminary chamber from below by said cassette elevator.

18. A substrate processing apparatus, comprising:
   a preliminary chamber; and
   a substrate transferring apparatus disposed in said preliminary chamber for transferring substrate or substrates in and out of a cassette which accommodates said substrate or said substrates, wherein
      said cassette is allowed to be inserted into said preliminary chamber through a lower wall of said preliminary chamber from below.

19. The substrate processing apparatus according to claim 18, wherein said lower wall of said preliminary chamber is a bottom wall of said preliminary chamber.

20. The substrate processing apparatus according to claim 18, wherein an inside surface of said preliminary chamber is adjacent to said substrate transferring apparatus both above and below said substrate transferring apparatus such that a volume of gas needed to fill said preliminary chamber is reduced.

21. The substrate processing apparatus according to claim 18, wherein said preliminary chamber has a cassette port through which said cassette is inserted into said preliminary chamber.

22. The substrate processing apparatus according to claim 21, further comprising a shutter for covering said cassette port when said cassette is outside of said preliminary chamber.

23. The substrate processing apparatus according to claim 21, further comprising a cassette elevator having a cap for covering said cassette port when said cassette is inside of said preliminary chamber, wherein said cassette is inserted into said preliminary chamber from below by said cassette elevator.

* * * * *